United States Patent
Ohse et al.

(10) Patent No.: US 10,600,921 B2
(45) Date of Patent: Mar. 24, 2020

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki-shi, Kanagawa (JP)

(72) Inventors: Naoyuki Ohse, Tsukuba (JP); Fumikazu Imai, Tsukuba (JP); Tsunehiro Nakajima, Matsumoto (JP); Kenji Fukuda, Tsukuba (JP); Shinsuke Harada, Tsukuba (JP); Mitsuo Okamoto, Tsukuba (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/152,522

(22) Filed: May 11, 2016

(65) Prior Publication Data

US 2016/0254393 A1 Sep. 1, 2016

Related U.S. Application Data

(63) Continuation of application No. PCT/JP2014/079996, filed on Nov. 12, 2014.

(30) Foreign Application Priority Data

Nov. 22, 2013 (JP) ................. 2013-242367

(51) Int. Cl.
*H01L 29/872* (2006.01)
*H01L 29/16* (2006.01)
(Continued)

(52) U.S. Cl.
CPC ........ *H01L 29/8725* (2013.01); *H01L 21/046* (2013.01); *H01L 21/0495* (2013.01);
(Continued)

(58) Field of Classification Search
CPC ............... H01L 21/046; H01L 29/8725; H01L 21/0495; H01L 29/1608; H01L 29/167;
(Continued)

(56) References Cited

U.S. PATENT DOCUMENTS 6,599,644 B1 * 7/2003 Zekentes ............. H01L 21/0485
257/750
6,884,644 B1 * 4/2005 Slater, Jr. ............. H01L 21/0485
257/77
(Continued)

FOREIGN PATENT DOCUMENTS

CN 101335201 A * 12/2008
CN 102187464 A 9/2011
(Continued)

OTHER PUBLICATIONS

Hanamura et. al., "Heat Resistant Metallization Technique for SiC Power Devices", Review of Automotive Engineering 29 (2008) 375-380; (c) Society of Automotive Engineers of Japan., All Rights reserved.*

*Primary Examiner* — Ismail A Muse
*Assistant Examiner* — Charles N Ausar-El
(74) *Attorney, Agent, or Firm* — Rabin & Berdo, P.C.

(57) ABSTRACT

In forming an ohmic electrode on a back surface of an n-type SiC substrate, an $n^+$-type semiconductor region is formed in a surface layer of the back surface of an n-type epitaxial substrate by ion implantation. In this ion implantation, the impurity concentration of the $n^+$-type semiconductor region is a predetermined range and preferably a predetermined value or less, and an n-type impurity is implanted by acceleration energy of a predetermined range such that the $n^+$-type semiconductor region has a predetermined thickness or less. Thereafter, a nickel layer and a titanium layer are sequentially formed on the surface of the $n^+$-type semicon- ductor region, the nickel layer is heat treated to form a (Continued)

silicide, and the ohmic electrode formed from nickel silicide is formed. In this manner, a back surface electrode that has favorable properties can be formed while peeling of the back surface electrode can be suppressed.

8 Claims, 5 Drawing Sheets

(51) Int. Cl.
    *H01L 21/04*         (2006.01)
    *H01L 29/66*         (2006.01)
    *H01L 29/47*         (2006.01)
    *H01L 29/167*       (2006.01)

(52) U.S. Cl.
    CPC ........ *H01L 29/167* (2013.01); *H01L 29/1608* (2013.01); *H01L 29/47* (2013.01); *H01L 29/6606* (2013.01); *H01L 29/66143* (2013.01); *H01L 29/872* (2013.01)

(58) Field of Classification Search
    CPC ................. H01L 29/47; H01L 29/6606; H01L 29/66143; H01L 29/872
    See application file for complete search history.

(56) References Cited

U.S. PATENT DOCUMENTS

| | | | | |
|---|---|---|---|---|
| 7,851,881 | B1* | 12/2010 | Zhao | H01L 21/0495 257/155 |
| 8,368,165 | B2* | 2/2013 | Richieri | H01L 29/872 257/473 |
| 8,487,318 | B2* | 7/2013 | Nakano | H01L 21/046 257/330 |
| 8,748,937 | B2* | 6/2014 | Sugawara | H01L 29/7395 257/139 |
| 8,962,468 | B1* | 2/2015 | Hostetler | H01L 21/046 438/602 |
| 9,252,218 | B2* | 2/2016 | Tsuji | H01L 29/40 |
| 9,613,809 | B2* | 4/2017 | Horii | H01L 21/0455 |
| 2002/0179910 | A1* | 12/2002 | Slater, Jr. | H01L 21/046 257/77 |
| 2004/0171204 | A1* | 9/2004 | Slater, Jr. | H01L 21/046 438/200 |
| 2005/0269661 | A1* | 12/2005 | Singh | H03K 17/567 257/492 |
| 2005/0280114 | A1* | 12/2005 | Singh | H01L 27/0814 257/502 |
| 2006/0065899 | A1* | 3/2006 | Hatakeyama | H01L 29/045 257/77 |
| 2009/0042375 | A1* | 2/2009 | Sawada | H01L 21/045 438/522 |
| 2009/0272982 | A1* | 11/2009 | Nakamura | H01L 29/66848 257/77 |
| 2010/0193799 | A1* | 8/2010 | Nakano | H01L 29/1608 257/77 |
| 2010/0207125 | A1* | 8/2010 | Uchida | H01L 21/0485 257/77 |
| 2011/0198617 | A1 | 8/2011 | Iwanaga et al. | |
| 2012/0028453 | A1* | 2/2012 | Matsuno | H01L 21/046 438/522 |
| 2012/0097980 | A1 | 4/2012 | Masuda et al. | |
| 2012/0139084 | A1* | 6/2012 | Hagleitner | H01L 21/28575 257/615 |
| 2012/0214309 | A1 | 8/2012 | Itoh et al. | |
| 2013/0020587 | A1 | 1/2013 | Hino et al. | |
| 2013/0062622 | A1* | 3/2013 | Tsuchiya | H01L 29/7394 257/77 |
| 2013/0062723 | A1* | 3/2013 | Henning | H01L 29/8611 257/484 |
| 2013/0082285 | A1 | 4/2013 | Kudou et al. | |
| 2013/0244428 | A1* | 9/2013 | Ohno | H01L 21/0485 438/689 |
| 2015/0024581 | A1* | 1/2015 | Imai | H01L 29/872 438/571 |
| 2015/0048383 | A1 | 2/2015 | Tsuji et al. | |
| 2015/0129894 | A1* | 5/2015 | Kinoshita | H01L 29/6606 257/77 |
| 2015/0144965 | A1* | 5/2015 | Tsuji | H01L 29/47 257/77 |
| 2018/0013015 | A1* | 1/2018 | Sugiura | H01L 29/872 |

FOREIGN PATENT DOCUMENTS

| | | | |
|---|---|---|---|
| CN | 102782820 A | | 11/2012 |
| CN | 102870217 A | | 1/2013 |
| JP | 2003-086816 A | * | 3/2003 |
| JP | 2006-093206 A | | 4/2006 |
| JP | 2006-324585 A | * | 11/2006 |
| JP | 2008-135611 A | | 6/2008 |
| JP | 2013-211467 A | | 10/2013 |
| JP | 2013-232559 A | | 11/2013 |
| WO | WO 2012-032735 A1 | | 3/2012 |
| WO | WO 2013/157335 A1 | * | 10/2013 |
| WO | WO2013146446 A1 | * | 10/2013 |

\* cited by examiner

FIG.7
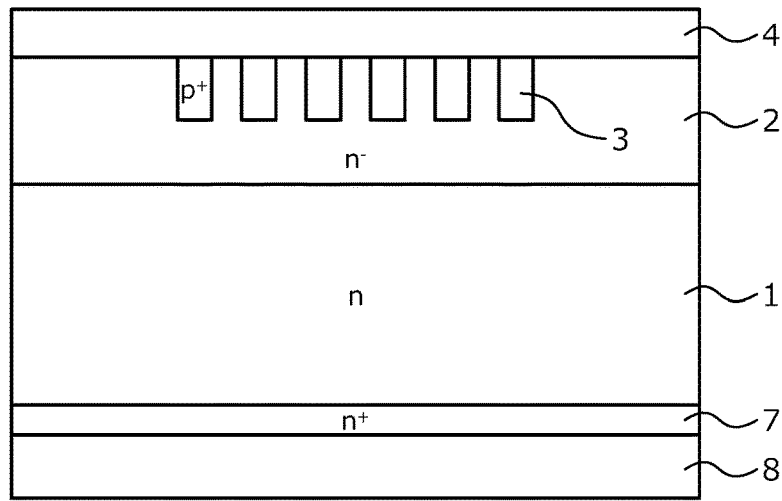
FIG.8
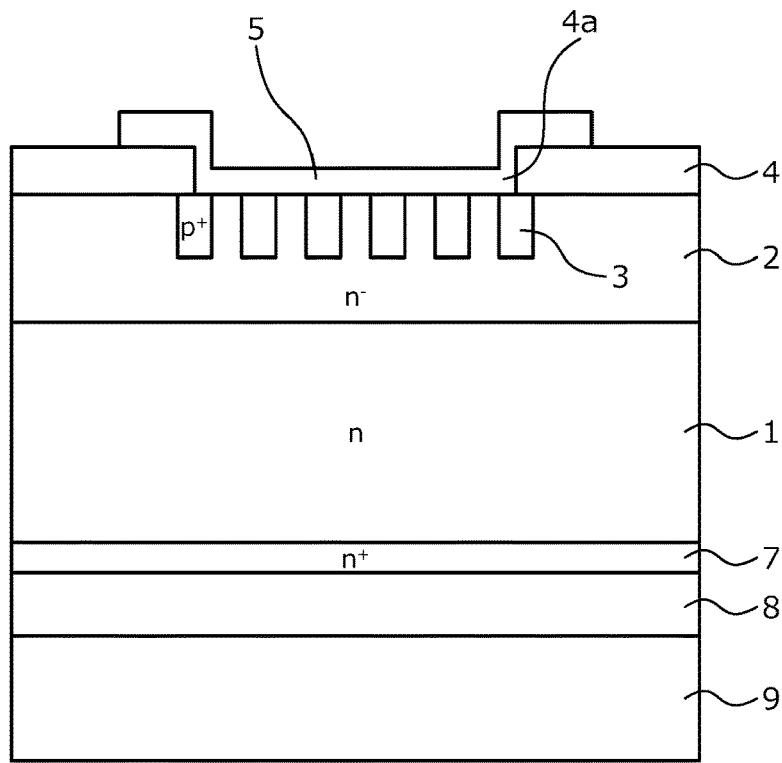
FIG.9
| | OCCURRENCE OF PEELING | CONTACT RESISTIVITY |
|---|---|---|
| EXAMPLE 1-1 | NO | $9.4 \times 10^{-6} \, \Omega cm^2$ |
| EXAMPLE 1-2 | NO | $1.3 \times 10^{-5} \, \Omega cm^2$ |
| COMPARISON EXAMPLE | YES | $8.0 \times 10^{-6} \, \Omega cm^2$ |

FIG.10
| | THICKNESS OF HIGH-CONCENTRATION IMPURITY LAYER | OCCURRENCE OF PEELING |
|---|---|---|
| FIRST SPECIMEN | 500 nm | YES |
| SECOND SPECIMEN | 400 nm | YES |
| THIRD SPECIMEN | 300 nm | YES |
| FOURTH SPECIMEN | 200 nm | NO |
| FIFTH SPECIMEN | 150 nm | NO |
FIG.11
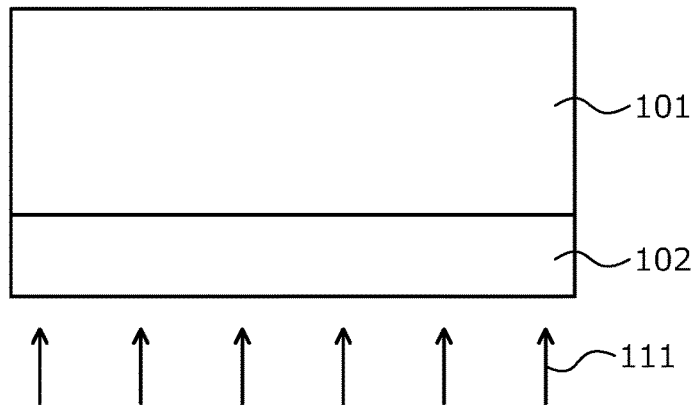
FIG.12
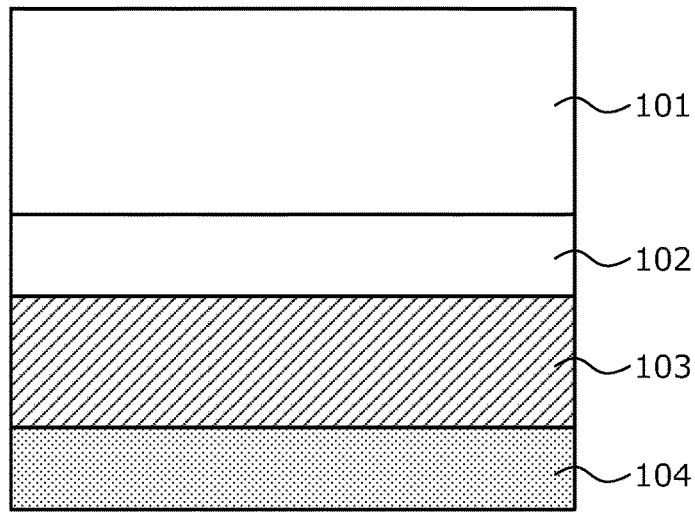

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This is a continuation application of International Application PCT/JP2014/079996 filed on Nov. 12, 2014 which claims priority from a Japanese Patent Application No. 2013-242367 filed on Nov. 22, 2013, the contents of which are incorporated herein by reference.

BACKGROUND OF THE INVENTION

1. Field of the Invention

The embodiments discussed herein are related to a silicon carbide semiconductor device and a method of manufacturing a silicon carbide semiconductor device.

2. Description of the Related Art

In recent years, silicon carbide (SiC) has gained attention as a semiconductor to replace silicon (Si). The bandgap of silicon carbide, for example, is 3.25 eV for 4-layer periodic hexagonal silicon carbide (4H—SiC), about 3 times greater than that of silicon (=1.12 eV). Consequently, use of silicon carbide as a semiconductor enables upper limit operating temperatures to be increased. Further, for example, the breakdown field strength of silicon carbide is 3.0 MV/cm for 4H—SiC, about 10 times greater than that for silicon (=0.25 MV/cm). Thus, ON resistivity inversely proportional to the cube of the breakdown field strength is decreased and steady-state power loss can be reduced.

The thermal conductivity of silicon carbide, for example, is 4.9 W/cmK for 4H—SiC, about 3 times higher than that of silicon (=1.5 W/cmK). Thus, a semiconductor device that uses silicon carbide (hereinafter, silicon carbide semiconductor device) has a higher thermal cooling effect than a semiconductor device that uses silicon (hereinafter, silicon semiconductor device) and is advantageous in that a smaller cooling apparatus can be used. Also, since the saturation drift velocity of a silicon carbide semiconductor device is high at $2\times10^7$ cm/s, silicon carbide semiconductor devices are also excellent for high-speed operation. Thus, silicon carbide has superior property values as compared to silicon and therefore, application to power semiconductor devices (hereinafter, power devices), high-frequency devices, and devices operated at high temperatures is expected.

Currently, prototypes of metal oxide semiconductor field effect transistors (MOSFET), pn diodes, Schottky diodes, etc. as silicon carbide semiconductor devices are being developed and devices that surpass silicon semiconductor devices in terms of dielectric breakdown voltage and ON resistivity are appearing one after another. ON resistivity is a ratio of forward voltage to forward current during energization (=forward voltage/forward current). In the production (manufacture) of such a silicon carbide semiconductor device, control of the carrier density, conductivity type, etc. of a predetermined region inside the semiconductor substrate, which is formed from silicon carbide (hereinafter, SiC substrate), is necessary.

Thermal diffusion methods, ion implantation methods, etc. are commonly known methods for controlling the carrier density, conductivity type, etc. of a predetermine region inside a SiC substrate. Thermal diffusion methods are widely used to produce silicon semiconductor devices. However, the impurity diffusion coefficient inside silicon carbide is extremely small and therefore, use of a thermal diffusion method to control the conductivity type, carrier density, etc. of a predetermine region inside a SiC substrate is difficult. Therefore, in the production of a silicon carbide semiconductor device, in general, an ion implantation method is used. In the formation of an n-type semiconductor region, nitrogen (N), phosphorus (P), etc. is often used for implantation whereas aluminum (Al), boron (B), etc. is often used for implantation when a p-type semiconductor region is formed.

A large capacity/high breakdown voltage power device has a vertical device structure in which current flows in a vertical direction of the semiconductor device, i.e., from a front surface toward a back surface of the semiconductor device, and voltage is applied between the front surface and the back surface of the semiconductor device. Therefore, a large capacity/high breakdown voltage power device is configured to have an electrode on the front surface and the back surface, respectively. For example, in the case of a Schottky diode, a Schottky electrode is disposed in a substrate front surface side and in a substrate back surface, an ohmic electrode is disposed having an ohmic contact, which is a contact (electrical contact portion) with a silicon portion. Further, in the case of a MOSFET, a source electrode and a gate electrode are disposed in a substrate front surface, and a drain electrode, which is an ohmic electrode, is disposed in a substrate back surface.

Typically, in a conventional method of manufacturing a silicon carbide semiconductor device, first, a silicon carbide epitaxial layer is grown on a front surface of a SiC substrate and thereafter, an ohmic electrode is formed in a back surface of the SiC substrate by vapor depositing a metal and performing heat treatment. Further, in a silicon carbide semiconductor device equipped with an ohmic electrode, when the contact resistivity of the SiC substrate and the ohmic electrode is high, the current (ON current) flowing in the active region during device operation is low compared to a case where the contact resistivity is low and the same voltage is applied. Therefore, as a method of reducing the contact resistivity of the SiC substrate and the ohmic electrode, formation of an ion implanted layer of a high impurity concentration in the back surface of the SiC substrate by ion implantation has been proposed (for example, refer to Japanese Laid-Open Patent Publication Nos. 2003-086816 and 2006-324585).

Nonetheless, although the formation of a high-concentration impurity layer in the substrate back surface is effective in reducing the contact resistivity of the SiC substrate and the ohmic electrode as described above, through the earnest research of the inventors, the following problems were found to occur with the techniques described in Japanese Laid-Open Patent Publication Nos. 2003-086816 and 2006-324585. FIGS. 11, 12, and 13 are cross-sectional views depicting states of a conventional silicon carbide semiconductor device during manufacture. Typically, in a conventional method of manufacturing a silicon carbide semiconductor device, first, as depicted in FIG. 11, ion implantation 111 is performed in the back surface of a SiC substrate 101 and a high-concentration semiconductor having an impurity concentration that is higher than that of the SiC substrate 101 is formed in a surface layer of the back surface of the SiC substrate 101. Next, as depicted in FIG. 12, a nickel (Ni) layer 103 and a titanium (Ti) layer 104 are sequentially formed in the surface of the high-concentration semiconductor region 102, as a back surface electrode.

Next, an anneal process (heat treatment) is performed to sinter the nickel layer 103 and the titanium layer 104.

Although the nickel layer 103 is converted to a silicide by this heat treatment and a nickel silicide layer 105 is formed as an ohmic electrode forming an ohmic contact with the SiC substrate 101 as depicted in FIG. 13, a layer of continuous deposited carbon (C) (hereinafter, deposited carbon layer) 106 is formed in the nickel silicide layer 105. Thus, it has been confirmed that under the conventional technique, the deposited carbon layer 106 is formed in the nickel silicide layer 105 and at the boundary of the deposited carbon layer 106, the back surface electrode (metal layer formed on the nickel silicide layer 105) peels, and a favorable back surface electrode having a low contact resistivity with the SiC substrate 101 cannot be formed.

SUMMARY OF THE INVENTION

According to one aspect of the present invention, a method of manufacturing a silicon carbide semiconductor device, includes implanting an impurity into a back surface of a semiconductor substrate formed from silicon carbide, and forming in a surface layer of the back surface of the semiconductor substrate, a high-concentration semiconductor region that has an impurity concentration that is higher than that of the semiconductor substrate; forming a metal electrode in a surface of the high-concentration semiconductor region; and forming an ohmic contact of the metal electrode and the high-concentration semiconductor region by heat treatment. The impurity concentration of the high-concentration semiconductor region is a range from $1\times10^{19}/cm^3$ to $8\times10^{20}/cm^3$. A thickness of the high-concentration semiconductor region is at most 200 nm, and the impurity is implanted by acceleration energy of 150 keV at most.

Further, in the method of manufacturing a silicon carbide semiconductor device, the high-concentration semiconductor region is formed to have a thickness that is thicker than a predetermined thickness and the thickness is reduced to the predetermined thickness that is at most 200 nm.

Further, in the method of manufacturing a silicon carbide semiconductor device, the impurity concentration of the high-concentration semiconductor region is at most $4\times10^{20}/cm^3$.

Further, in the method of manufacturing a silicon carbide semiconductor device, one of aluminum, phosphorus, arsenic, nitrogen, boron, magnesium, and gallium is implanted as the impurity.

Further, in the method of manufacturing a silicon carbide semiconductor device, when forming the metal electrode, a nickel layer and a titanium layer are sequentially formed in the surface of the high-concentration semiconductor region, and when forming the ohmic contact, the nickel layer and the high-concentration semiconductor region are heat treated so as to react and form a nickel silicide layer as the metal electrode.

Further, in the method of manufacturing a silicon carbide semiconductor device, when forming the metal electrode, a front surface device structure is formed in a front surface side of the semiconductor substrate.

According to another aspect of the present invention, a silicon carbide semiconductor device includes a high-concentration semiconductor region that is disposed in a surface layer of the back surface of a semiconductor substrate formed of silicon carbide and that has an impurity concentration that is higher than that of the semiconductor substrate; and a metal electrode that is disposed in a surface of the high-concentration semiconductor region and forms an ohmic contact with the high-concentration semiconductor region. The impurity concentration of the high-concentration semiconductor region is a range from $1\times10^{19}/cm^3$ to $8\times10^{20}/cm^3$. A thickness of the high-concentration semiconductor region is at most 200 nm, and the high-concentration semiconductor region is formed by implantation of one of aluminum, magnesium, and gallium.

Further, in the silicon carbide semiconductor device, the impurity concentration of the high-concentration semiconductor region is at most $4\times10^{20}/cm^3$.

Further, in the silicon carbide semiconductor device, the metal electrode is a nickel silicide layer.

Further, in the silicon carbide semiconductor device, a front surface device structure is disposed in a front surface side of the semiconductor substrate.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a cross-sectional view of a state of the silicon carbide semiconductor device according to the embodiment during manufacture;

FIG. 8 is a cross-sectional view of a state of the silicon carbide semiconductor device according to the embodiment during manufacture;

FIG. 9 is a chart of peeling test results for a back surface electrode of a silicon carbide semiconductor device according to a first example;

FIG. 10 is a chart of peeling test results for the back surface electrode of a silicon carbide semiconductor device according to example 2;

FIG. 11 is a cross-sectional view depicting a state of a conventional silicon carbide semiconductor device during manufacture;

FIG. 12 is a cross-sectional view depicting a state of a conventional silicon carbide semiconductor device during manufacture.

DETAILED DESCRIPTION OF THE INVENTION

Figure 1:
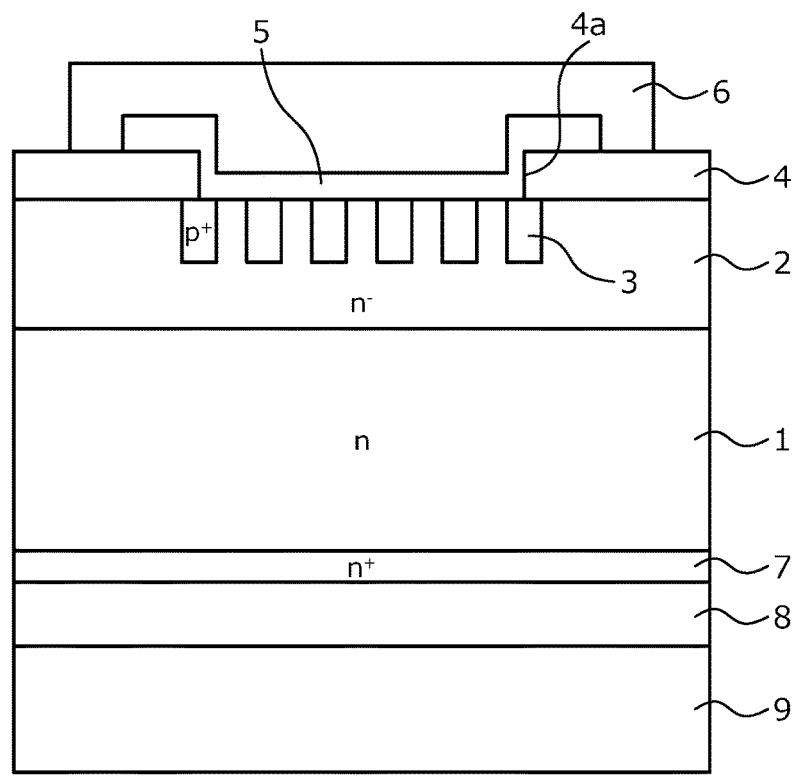
FIG. 1 is a cross-sectional view of an example of a silicon carbide semiconductor device manufactured by a method of manufacturing a silicon carbide semiconductor device according to an embodiment.

Preferred embodiments of a silicon carbide semiconductor device and a method of manufacturing a silicon carbide semiconductor device will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Embodiment

As a structure of a silicon carbide semiconductor device produced (manufactured) by the method of manufacturing a silicon carbide semiconductor device according to the embodiment, a Schottky barrier diode (hereinafter, SiC-SBD) will be described as an example. FIG. 1 is a cross-sectional view of a silicon carbide semiconductor device manufactured by the method of manufacturing a silicon carbide semiconductor device according to the embodiment. As depicted in FIG. 1, in the silicon carbide semiconductor device according to the embodiment, an $n^−$-type SiC epitaxial layer 2 that forms an $n^−$-type drift region is disposed on a front surface of an n-type semiconductor substrate (hereinafter, n-type SiC substrate) 1 formed from silicon carbide (SiC). A surface on an $n^−$-type SiC epitaxial layer 2 side of an n-type SiC epitaxial substrate formed by the n-type SiC substrate 1 and the $n^−$-type SiC epitaxial layer 2 is assumed as a front surface and a surface on an n-type SiC substrate 1 side of the n-type SiC epitaxial substrate is assumed as a back surface.

In a surface layer of the front surface of the n-type SiC epitaxial substrate, $p^+$-type semiconductor regions 3 configuring a junction barrier Schottky (JBS) structure are selectively disposed at predetermined intervals. An interlayer insulating film 4 is disposed on the front surface of the n-type SiC epitaxial substrate. In the interlayer insulating film 4, a contact hole 4a that exposes the front surface of the n-type SiC epitaxial substrate is disposed in an activation region where the $p^+$-type semiconductor regions 3 are formed. The activation region is a region where current flows during an ON state. A Schottky electrode 5 is disposed in the contact hole 4a of the interlayer insulating film 4 and abuts portions between the $p^+$-type semiconductor regions 3 and the $p^+$-type semiconductor regions 3 of the $n^−$-type SiC epitaxial layer 2. An end portion of the Schottky electrode 5 extends from the active region onto the interlayer insulating film 4. An electrode pad 6 formed from aluminum (Al), for example, is disposed on the Schottky electrode 5.

An $n^+$-type semiconductor region 7 is disposed in a surface layer of the back surface (back surface of the n-type SiC substrate 1) of the n-type SiC epitaxial substrate. The thickness of the $n^+$-type semiconductor region 7 is preferably, for example, 200 nm or less. The impurity concentration of the $n^+$-type semiconductor region 7 is, for example, $1\times10^{19}/cm^3$ or greater and $8\times10^{20}/cm^3$ or less, and preferably $4\times10^{20}/cm^3$ or less, for example. The reason for this is as follows. When the impurity concentration of the $n^+$-type semiconductor region 7 is less than $1\times10^{19}/cm^3$, a contact (electrical contact portion) with an ohmic electrode 8 described hereinafter cannot be made to be an ohmic contact. Further, when the impurity concentration of the $n^+$-type semiconductor region 7 exceeds $8\times10^{20}/cm^3$, the contact resistivity of the n-type SiC substrate 1 and the ohmic electrode 8 cannot be made to be comparable to or less than that conventionally.

The ohmic electrode 8 forms an ohmic contact with the n-type SiC substrate 1 ($n^+$-type semiconductor region 7) and is disposed on the surface of the $n^+$-type semiconductor region 7. The ohmic electrode 8 is preferably a nickel silicide layer formed by heat treating, for example, a nickel (Ni) layer and a titanium (Ti) layer sequentially stacked on the surface of the $n^+$-type semiconductor region 7. An external connection electrode layer 9 formed from, for example, gold (Au), is disposed on the surface of the ohmic electrode 8.

Figure 2:
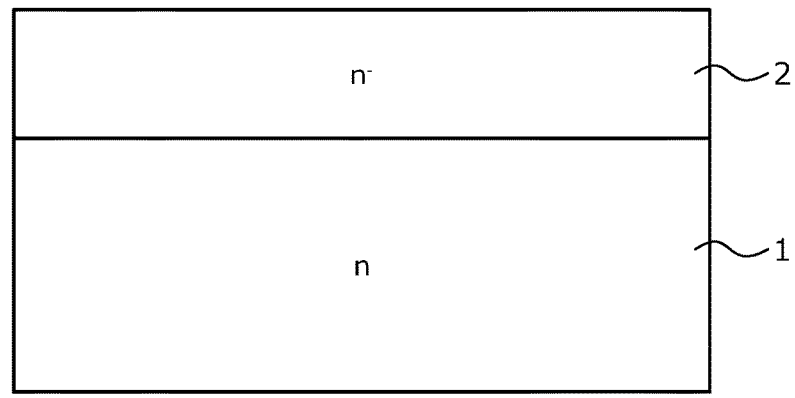
FIG. 2 is a cross-sectional view of a state of the silicon carbide semiconductor device according to the embodiment during manufacture.

Concerning the method of manufacturing a silicon carbide semiconductor device according to the embodiment, a case where the SiC-SBD depicted in FIG. 1 is produced will be described as an example. FIGS. 2, 3, 4, 5, 6, 7, and 8 are cross-sectional views of states of the silicon carbide semiconductor device according to the embodiment during manufacture. As the n-type SiC substrate (semiconductor wafer) 1, for example, a 4-layer periodic hexagonal silicon carbide (4H—SiC) substrate is prepared that has a thickness of about 350 μm and is doped with nitrogen (N) on the order of $1\times10^{16}/cm^3$. The front surface of the n-type SiC substrate 1, for example, has an off angle of about 4 degrees with respect to the (0001) face. Next, as depicted in FIG. 2, on the front surface of the n-type SiC substrate 1, for example, the $n^−$-type SiC epitaxial layer 2, which is doped with nitrogen on the order of $5.0\times10^{15}/cm^3$, is grown and has a thickness of about 6 μm.

Figure 3:
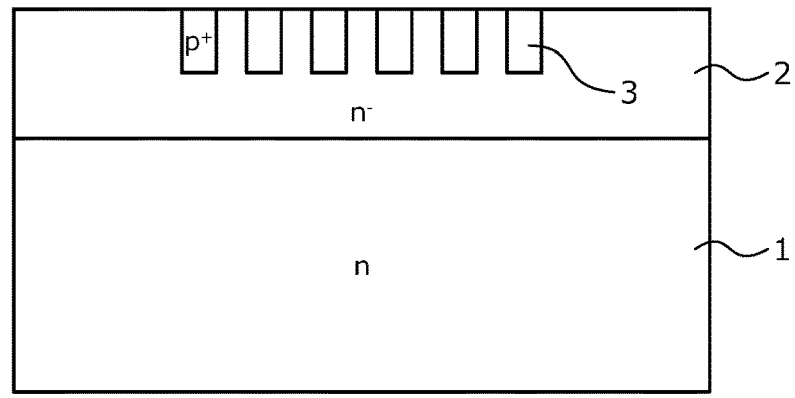
FIG. 3 is a cross-sectional view of a state of the silicon carbide semiconductor device according to the embodiment during manufacture.

As depicted in FIG. 3, in the surface layer of the front surface (surface on the $n^−$-type SiC epitaxial layer 2 side) of the n-type SiC epitaxial substrate formed from the n-type SiC substrate 1 and the $n^−$-type SiC epitaxial layer 2, the $p^+$-type semiconductor regions 3, for example, are selectively formed at 2-μm intervals. More specifically, for example, at a temperature of about 500 degrees C., the n-type SiC epitaxial substrate is heated while first ion implantation is selectively performed in the front surface of the n-type SiC epitaxial substrate, whereby the $p^+$-type semiconductor regions 3 are formed. In this first ion implantation, for example, the box profile impurity concentration from the substrate front surface to a depth of about 500 nm is about $2\times10^{19}/cm^3$ and a p-type impurity such as aluminum is implanted by acceleration energy of a range from 30 keV to 350 keV.

Figure 4:
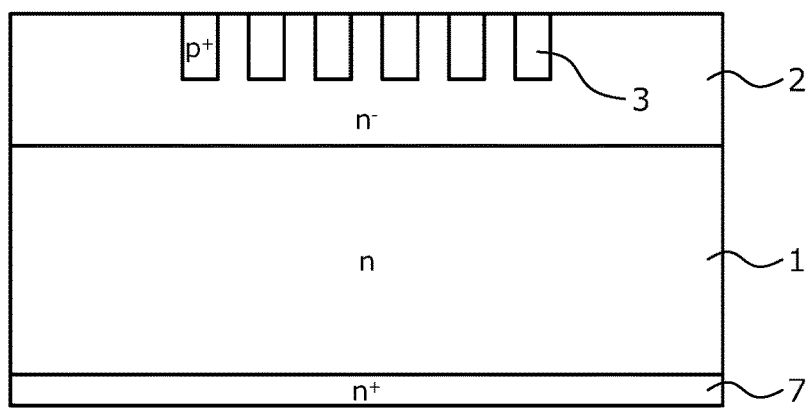
FIG. 4 is a cross-sectional view of a state of the silicon carbide semiconductor device according to the embodiment during manufacture.

Next, as depicted in FIG. 4, the $n^+$-type semiconductor region 7 is formed in the surface layer of the back surface (surface of the n-type SiC substrate 1 side) of the n-type SiC epitaxial substrate. More specifically, with the substrate heated to a temperature of about 500 degrees C., second ion implantations are performed in the entire back surface of the n-type SiC epitaxial substrate, whereby the $n^+$-type semiconductor region 7 is formed. In the second ion implantation, for example, an n-type impurity such as phosphorus (P) is implanted by acceleration energy of a range from 30 keV to 150 keV such that the box profile impurity concentration from the substrate back surface after product completion to a depth of about 200 nm (i.e., the thickness of the $n^+$-type semiconductor region 7 after product completion) becomes within the above-described impurity concentration range of the $n^+$-type semiconductor region 7.

Figure 5:
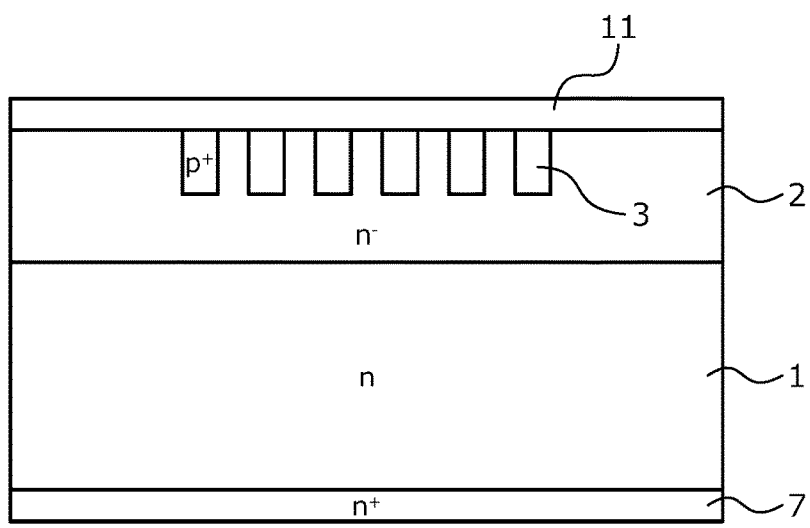
FIG. 5 is a cross-sectional view of a state of the silicon carbide semiconductor device according to the embodiment during manufacture.

Next, as depicted in FIG. 5, heat treatment is performed to activate the impurities implanted by the first and the second ion implantations. More specifically, after the entire front surface of the n-type SiC epitaxial substrate, for example, is protected by a carbon protection film 11, the n-type SiC epitaxial substrate is inserted into a processing furnace of an activation heat treating apparatus. After the processing furnace of the activation heat treating apparatus, for example, is set to about $1\times10^{-2}$ Pa or greater, argon (Ar) gas is introduced into the processing furnace and, for example, at a pressure of about $1\times10^5$ Pa, heat treatment at a temperature of about 1700 degrees C. is performed for about 5 minutes.

Figure 6:
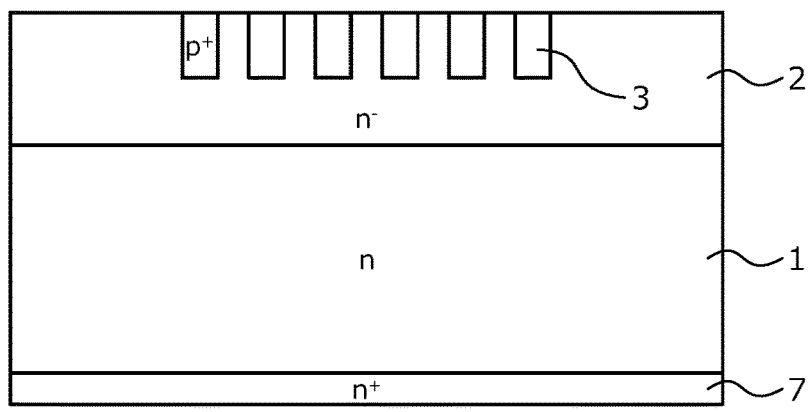
FIG. 6 is a cross-sectional view of a state of the silicon carbide semiconductor device according to the embodiment during manufacture.
Figure 13:
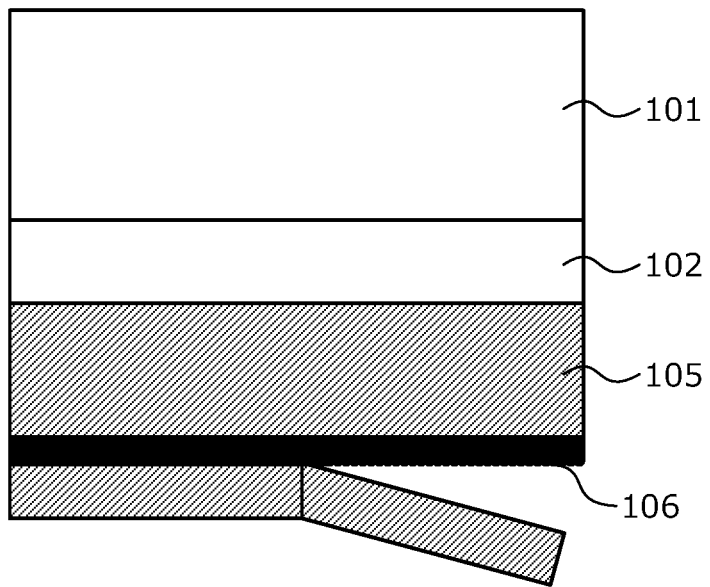
FIG. 13 is a cross-sectional view depicting a state of a conventional silicon carbide semiconductor device during manufacture.

Next, as depicted in FIG. 6, for example, the carbon protection film 11 is removed (ashed) by an ashing apparatus. More specifically, for example, a reactive ion etching (RIE) apparatus is used as the ashing apparatus. For example, oxygen ($O_2$) gas is introduced into the reaction furnace of the RIE apparatus and under pressure of about 6 Pa, high frequency (RF) power of about 500 W is applied, whereby ashing is performed in an oxygen plasma atmosphere for about 5 minutes. Next, for example, in a diffusion furnace, by pyrogenic oxidation, the back surface of the n-type SiC epitaxial substrate is sacrificially oxidized. Next, for example, by buffered hydrofluoric acid etching, the sacrificial oxidized film on the substrate back surface is removed and the thickness of the $n^+$-type semiconductor region 7 is reduced by about 100 nm. Thus, the thickness of the $n^+$-type semiconductor region 7 becomes 200 nm or less.

Next, as depicted in FIG. 7, by a chemical vapor deposition method (CVD), for example, the interlayer insulating film 4 is formed in the front surface of the n-type SiC epitaxial substrate and has a thickness of 500 nm. Next, for example, by a physical vapor deposition (PVD) method such as sputtering, a nickel layer and a titanium layer are sequentially stacked (formed) in the back surface of the n-type SiC epitaxial substrate. For example, at a temperature of about 800 degrees C., heat treatment is performed for about 10 minutes, whereby the n-type SiC epitaxial substrate is heated and the nickel layer and the titanium layer on the substrate back surface are sintered. The nickel layer is converted into a silicide by this heat treatment and by the formation of a nickel silicide layer that includes titanium carbide as the ohmic electrode 8, an ohmic contact of the ohmic electrode 8 and the n-type SiC substrate 1 (i.e., the $n^+$-type semiconductor region 7) is formed.

Next, as depicted in FIG. 8, by photolithography, the contact hole 4a is formed in the interlayer insulating film 4, exposing the active region in which the $p^+$-type semiconductor regions 3 of the front surface of the n-type SiC epitaxial substrate are formed. Next, for example, by a physical vapor deposition method such as sputtering, the titanium layer is formed in the entire substrate front surface so as to contact the silicon portion (the $n^-$-type SiC epitaxial layer 2 and the $p^+$-type semiconductor regions 3) in the contact hole 4a. Next, by photolithography, the titanium layer on the substrate front surface is patterned into the Schottky electrode 5. Next, for example, the titanium layer on the substrate front surface is sintered by heat treatment at a temperature of about 500 degrees C. for about 10 minutes and the Schottky electrode 5 is formed.

Next, for example, an aluminum layer of a thickness of about 5 µm is formed as the electrode pad 6 on the Schottky electrode 5, by a physical vapor deposition method such as sputtering. Further, for example, a gold layer of a thickness of about 200 nm, for example, is formed as the external connection electrode layer 9 on the ohmic electrode 8, by a physical vapor deposition method such as sputtering, whereby the SiC-SBD depicted in FIG. 1 is completed.

Example 1

The relationship of impurity concentration and thickness of the $n^+$-type semiconductor region 7 and the occurrence of peeling of the back surface electrode (the ohmic electrode 8 and the external connection electrode layer 9) will be described. FIG. 9 is a chart of peeling test results for the back surface electrode of the silicon carbide semiconductor device according to the first example. The SiC-SBD depicted in FIG. 1 was produced according to the method of manufacturing a silicon carbide semiconductor device according to the embodiment under the following conditions (hereinafter, examples 1-1, 1-2). More specifically, in example 1-1, the second ion implantation was performed by an acceleration energy such that the box profile impurity concentration and thickness of the $n^+$-type semiconductor region 7 after product completion (hereinafter, simply, the impurity concentration and thickness of the $n^+$-type semiconductor region 7) became $8\times10^{20}/cm^3$ and 200 nm, respectively.

In example 1-2, the second ion implantation was performed by an acceleration energy such that the impurity concentration and thickness of the $n^+$-type semiconductor region 7 became $4\times10^{20}/cm^3$ and 200 nm, respectively. Excluding the condition for the impurity concentration of the $n^+$-type semiconductor region 7, conditions for example 1-2 were the same as those for example 1-1. For comparison, a sample was produced based on different second ion implantation conditions (hereinafter, comparison example). For the comparison example, in the second ion implantation, phosphorus was implanted in multiple stages by acceleration energy ranging from 30 keV to 350 keV such that the box profile impurity concentration from the substrate back surface to a depth of about 500 nm after device completion became $8\times10^{20}/cm^3$. Excluding the second ion implantation condition, conditions for the comparison example were the same as those for example 1-1.

A general peeling test was performed with respect to the back surface electrode of examples 1-1, 1-2 and the comparison example. The results are shown in FIG. 9. From the results depicted in FIG. 9, it was confirmed that in example 1-1, although the contact resistivity (contact resistivity) of the n-type SiC substrate 1 and the ohmic electrode 8 was about the same as that for the comparison example, the back surface electrode did not peel (peeling: NO). Further, in example 1-2, it was confirmed that the contact resistivity of the n-type SiC substrate 1 and the ohmic electrode 8 could be reduced and no peeling of the back surface electrode occurred. In contrast, with the comparison example, it was confirmed that although the contact resistivity of the n-type SiC substrate 1 and the ohmic electrode 8 was maintained to be about the same as that for example 1-1, the ohmic electrode 8 fractured and the back surface electrode peeled (peeling: YES).

In examples 1-1, 1-2, the back surface electrode did not peel for the following reasons. The acceleration energy of the second ion implantation for forming the $n^+$-type semiconductor region 7 was set to about 150 keV or less and the thickness of the $n^+$-type semiconductor region 7, which is the source of carbon to the ohmic electrode 8, was set to 200 nm or less, whereby the amount of carbon deposited at the ohmic electrode 8 could be reduced. As a result, inside the ohmic electrode 8, the deposited carbon layer (the layer of continuous deposited carbon) that causes peeling of the back surface electrode is not formed. Further, as in example 1-2, the impurity concentration of the $n^+$-type semiconductor region 7 is set to be less than $8\times10^{20}/cm^3$, whereby the contact resistivity of the n-type SiC substrate 1 and the ohmic electrode 8 can be reduced. Therefore, as with examples 1-1, 1-2, it was confirmed that by controlling the impurity concentration and thickness of the $n^+$-type semiconductor region 7, peeling of the back surface electrode could be prevented while the contact resistivity of the n-type SiC substrate 1 and the ohmic electrode 8 was maintained or reduced.

Example 2

The relationship of the thickness of the $n^+$-type semiconductor region 7 and the occurrence of peeling of the back surface electrode will be described. FIG. 10 is a chart of peeling test results for the back surface electrode of the silicon carbide semiconductor device according to example 2. First to fifth specimens in which the thickness of the $n^+$-type semiconductor region 7 (in FIG. 10, indicated as high-concentration impurity layer) respectively differed were produced in example 2. In the first to fifth specimens, the thickness of the $n^+$-type semiconductor region 7 was 500 nm, 400 nm, 300 nm, 200 nm, and 150 nm, respectively. Excluding the condition of the thickness of the $n^+$-type semiconductor region 7, the conditions for example 2 were the same as those for example 1-1. In example 2, the acceleration energy of the second ion implantation was the same as that for example 1-1 and the number of implantation phases of the second ion implantation was increased/decreased to change the thickness of the $n^+$-type semiconductor region 7. In other words, the thickness of the $n^+$-type semiconductor region 7 was increased by increasing the number of implantation phases of second ion implantation and for the first specimen, which had the thickest $n^+$-type semiconductor region 7, the number of implantation phases of the second ion implantation was the greatest and for the fifth specimen, which had the thinnest $n^+$-type semiconductor region 7, the number of implantation phases was the least. The fourth specimen corresponds to example 1-1.

A general peeling test was performed with respect to the back surface electrodes of the first to fifth specimens. The results are shown in FIG. 10. From the results indicated in FIG. 10, it was confirmed that peeling of the back surface electrode could be prevented by making the thickness of the $n^+$-type semiconductor region 7 be 200 nm or less (fourth and fifth specimens). Therefore, it was confirmed that a thickness of 200 nm or less for the $n^+$-type semiconductor region 7 is effective. Further, it was confirmed that when the thickness of the $n^+$-type semiconductor region 7 is 200 nm or less, the number of implantation phases of the second ion implantation for forming the $n^+$-type semiconductor region 7 can be reduced, enabling throughput to be improved.

As described above, according to the embodiment, the acceleration energy in the second ion implantation for forming the high-concentration semiconductor region ($n^+$-type semiconductor region) on the back surface side of the SiC substrate is set to about 150 keV or less and the thickness of the high-concentration semiconductor region is set to about 200 nm or less, whereby during heat treatment to form the nickel silicide layer (ohmic electrode), carbon atoms inside the high-concentration semiconductor region can be controlled to suppress deposition in the nickel silicide layer. As a result, the amount of carbon deposited at the nickel silicide layer can be reduced and the layer of continuous deposited carbon inside the nickel silicide layer (deposited carbon layer) does not form. Therefore, peeling of the back surface electrode (ohmic electrode and external connection electrode layer) caused by the carbon in the nickel silicide layer can be sufficiently suppressed. Further, according to the embodiment, the impurity concentration of the high-concentration semiconductor region formed in the back surface of the SiC substrate is set to $8\times10^{20}/cm^3$ or less, whereby the contact resistivity of the SiC substrate (i.e., high-concentration semiconductor region) and of the ohmic electrode can be maintained or reduced. As a result, decreases in the current (ON current) that flows in the activated region during device operation can be prevented, enabling a back surface electrode that has favorable properties to be formed.

Although a SBD has been described as an example in the present invention, the invention is not limited hereto and, for example, is applicable to other semiconductor devices that use silicon carbide such as MOSFETs, insulated gate bipolar transistors (IGBT), diodes, etc. In other words, in the embodiment described, by variously modifying front surface device structures formed on the front surface side of a SiC substrate, a silicon carbide semiconductor device can be produced to have various configurations equipped with an ohmic electrode on the substrate back surface. In the embodiment, although description has been given taking a case where phosphorus is used as a dopant in the second ion implantation for forming the high-concentration semiconductor region in the back surface of the SiC substrate, the invention is not limited hereto and various modifications corresponding to back surface device structures are possible. More specifically, for example, when an n-type high-concentration semiconductor region is formed by the second ion implantation, phosphorus, arsenic (As), nitrogen (N) can be used; when a p-type high-concentration semiconductor region is formed by the second ion implantation, aluminum, boron (B), magnesium (Mg), gallium (Ga) can be used. Further, in the described embodiment, although use of an epitaxial substrate on which $n^-$type SiC epitaxial layers are stacked on an n-type SiC substrate is described, the invention is not limited hereto and an $n^-$type SiC substrate of a thickness equivalent to that of the epitaxial substrate may be used. Further, the present invention is also effective even when the conduction types (n-type, p-type) of the semiconductor substrate or semiconductor layers are inversed in the described embodiment.

As a result of earnest research, the inventors found the following. With the described conventional techniques, carbon atoms in the high-concentration semiconductor region 102 are presumed to be deposited in the nickel silicide layer 105 to form the deposited carbon layer 106 during the heat treatment for forming the nickel silicide layer 105. In this regard, the inventors found that by adjusting the impurity concentration of the high-concentration semiconductor region and the depth of from the substrate back surface, contact resistivity of the ohmic electrode (nickel silicide layer) and the SiC substrate (high-concentration semiconductor region) comparable to or less than that obtained by the conventional techniques can be achieved without the formation of the deposited carbon layer in the nickel silicide layer. The present invention is based on this finding.

According to the described invention, by setting the thickness of the high-concentration semiconductor region to about 200 nm or less, carbon atoms inside the high-concentration semiconductor region can be controlled to suppress deposition in the metal electrode. As a result, the amount of carbon deposited at the metal electrode from the high-concentration semiconductor region can be reduced, and the layer of continuous deposited carbon inside the metal electrode does not form. Therefore, the peeling of the metal electrode caused by the carbon in the metal electrode can be prevented. Further, according to the present invention, the impurity concentration of the high-concentration semiconductor region is set to $8\times10^{20}/cm^3$ or less, whereby the contact resistivity of the high-concentration semiconductor region and the metal electrode can be made comparable to or less than that conventionally. As a result, decreases in the current that flows in the activated region during device operation can be prevented.

The silicon carbide semiconductor device and the method of manufacturing a silicon carbide semiconductor device according to the present invention achieve an effect in that the peeling of the back surface electrode can be suppressed while enabling the back surface electrode to be formed to have favorable properties.

As described, the silicon carbide semiconductor device and method of manufacturing a silicon carbide semiconductor device according to the present invention are useful in power semiconductors equipped with a metal electrode forming an ohmic contact with a silicon carbide semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device, comprising:
   implanting an impurity into a back surface of a semiconductor substrate formed from silicon carbide to thereby form in a surface layer of the back surface of the semiconductor substrate a high-concentration semiconductor region that has an impurity concentration that is higher than that of the semiconductor substrate, the high-concentration semiconductor region formed to a thickness greater than 200 nm;
   forming a carbon protection film on a front surface semiconductor device structure;
   performing heat treatment of the semiconductor substrate, including the carbon protection film, to activate the impurity in the back surface of the semiconductor substrate;
   after performing the heat treatment of the semiconductor substrate to activate the impurity in the back surface of the semiconductor substrate, removing a portion of the back surface of the semiconductor substrate to reduce a thickness of the high-concentration semiconductor region to a thickness of 200 nm or less;
   forming a metal electrode on a surface of the high-concentration semiconductor region; and
   performing a heat treatment to form an ohmic contact of the metal electrode and the high-concentration semiconductor region, wherein
   the impurity concentration of the high-concentration semiconductor region is a range from $1 \times 10^{19}/cm^3$ to $8 \times 10^{20}/cm^3$,
   the impurity is implanted by acceleration energy of 150 keV or less, and
   one of aluminum, phosphorus, arsenic, nitrogen, boron, magnesium, and gallium is implanted as the impurity.

2. The method according to claim 1, wherein
   the impurity concentration of the high-concentration semiconductor region is $4 \times 10^{20}/cm^3$ or less.

3. The method according to claim 1, further comprising: forming a front surface semiconductor device structure in a front surface side of the semiconductor substrate.

4. The method according to claim 3, wherein forming the front surface semiconductor device structure includes performing ion implantation in the front surface of the semiconductor substrate to form a plurality of semiconductor regions having an impurity concentration different than the semiconductor substrate, the plurality of semiconductor regions spaced apart from each other.

5. The method according to claim 4, further comprising: forming a Schottky electrode on the plurality of semiconductor regions.

6. The method according to claim 5, wherein forming the Schottky electrode comprises:
   forming an insulating film on the semiconductor substrate and the plurality of semiconductor regions;
   removing a portion of the insulating film over an active region of the semiconductor substrate including the plurality of semiconductor regions; and
   depositing a conductive material on the insulating film and the active region to form the Schottky electrode, such that the Schottky electrode covers the active region and extends past edges of the active region onto the insulating film.

7. The method according to claim 6, wherein the conductive material is titanium.

8. The method of manufacturing the silicon carbide semiconductor device according to claim 6, further comprising:
   forming an electrode pad on the Schottky electrode and the insulating film, such that the electrode pad extends past ends of the Schottky electrode to cover portions of the insulating film.

* * * * *